US012685095B2

(12) United States Patent
Sheng et al.

(10) Patent No.:     US 12,685,095 B2
(45) Date of Patent:          Jul. 14, 2026

(54) IN-SITU INTEGRATED WAFER PARAMETER DETECTION SYSTEM WITH REMOTE PLASMA CLEANING

(71) Applicant: Applied Materials, Inc., Santa Clara, CA (US)

(72) Inventors: Shuran Sheng, Santa Clara, CA (US); Eric Hollar, Sunnyvale, CA (US); Sock Hoon Lim, Singapore (SG); Yu Yang, Fremont, CA (US); Ralph P. Antonio, Santa Clara, CA (US); Gu Liu, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 898 days.

(21) Appl. No.: 17/751,511

(22) Filed: May 23, 2022

(65) Prior Publication Data

US 2023/0378006 A1     Nov. 23, 2023

(51) Int. Cl.
   *H01L 21/66*          (2006.01)
   *G01J 3/44*           (2006.01)
   *G01N 21/95*          (2006.01)
   *H01J 37/32*          (2006.01)
   *H10P 70/00*          (2026.01)
   *H10P 74/00*          (2026.01)
   *H10P 74/20*          (2026.01)
   *G06N 20/00*          (2019.01)

(52) U.S. Cl.
   CPC .............. *H10P 74/277* (2026.01); *G01J 3/44* (2013.01); *G01N 21/9501* (2013.01); *H01J*

*37/32862* (2013.01); *H10P 70/00* (2026.01); *H10P 74/203* (2026.01); *G06N 20/00* (2019.01)

(58) Field of Classification Search
None
See application file for complete search history.

(56) References Cited

U.S. PATENT DOCUMENTS

|  |  |  |
|---|---|---|
| 7,101,251 B2 | 9/2006 | Swedek et al. |
| 7,252,097 B2 | 8/2007 | Boyd et al. |
| 10,014,198 B2 | 7/2018 | Richardson |
| 2003/0045098 A1 | 3/2003 | Verhaverbeke et al. |
| 2005/0032250 A1 | 2/2005 | Mui et al. |
| 2005/0174583 A1 | 8/2005 | Chalmers et al. |

(Continued)

OTHER PUBLICATIONS

PCT International Seach Report and Written Opinion for PCT/US2023/023037 dated Sep. 15, 2023.

*Primary Examiner* — Bernard G Lindsay
(74) *Attorney, Agent, or Firm* — Moser Taboada

(57)          ABSTRACT

Methods and systems for monitoring wafer processing results continuously and in real-time. In some embodiments, a system may comprise at least one non-active chamber with at least one feedthrough access port which is configured to interact with a metrology apparatus. The feedthrough access port has a surface exposed to an inner volume of the non-active chamber and has a fluorine-based coating covering the surface. The non-active chamber has a wafer access port to one or more other chambers. The metrology apparatus is positioned external to the non-active chamber and is oriented to detect metrology data through one of the feedthrough access ports. A data collection apparatus is connected to the metrology apparatus and configured to continuously receive data from the metrology apparatus.

20 Claims, 6 Drawing Sheets

(56)         References Cited

U.S. PATENT DOCUMENTS

| | | | |
|---|---|---|---|
| 2005/0219520 A1* | 10/2005 | Chen | G01N 21/68 |
| | | | 356/237.2 |
| 2007/0196011 A1* | 8/2007 | Cox | H01L 21/67167 |
| | | | 382/145 |
| 2008/0066778 A1* | 3/2008 | Matsushita | C23C 16/4405 |
| | | | 134/1.1 |
| 2008/0275658 A1* | 11/2008 | Harvey | G01N 21/73 |
| | | | 356/73 |
| 2011/0304078 A1* | 12/2011 | Lee | H01L 21/67201 |
| | | | 264/344 |
| 2012/0118224 A1 | 5/2012 | Bour et al. | |
| 2013/0142595 A1* | 6/2013 | Shimomura | H01L 21/67184 |
| | | | 414/217 |
| 2015/0311043 A1* | 10/2015 | Sun | C23C 4/11 |
| | | | 427/523 |
| 2016/0077025 A1 | 3/2016 | Zhang et al. | |
| 2018/0304435 A1* | 10/2018 | Xu | B24B 37/013 |
| 2020/0083070 A1 | 3/2020 | Clark et al. | |
| 2020/0083074 A1 | 3/2020 | Clark et al. | |
| 2020/0338688 A1* | 10/2020 | Hong | B24B 57/02 |
| 2022/0301835 A1* | 9/2022 | Luo | G02B 7/007 |

* cited by examiner

IN-SITU INTEGRATED WAFER PARAMETER DETECTION SYSTEM WITH REMOTE PLASMA CLEANING

FIELD

Embodiments of the present principles generally relate to semiconductor processing of semiconductor substrates.

BACKGROUND

During wafer processing, critical parameters may change unintentionally. To prevent the parameters from changing, the wafers are often tested after the processing using stand-alone metrology systems. However, stopping to perform the tests adds substantial delays and reduces the wafer processing throughput. Although the standalone metrology systems may accurately determine that a parameter is not within a predetermined tolerance or specification, the timing of the information typically occurs after one or more lots of wafers have been processed. If the out of tolerance parameter results in unusable wafers, the wafers will be thrown out or scrapped. The loss of the wafers can be extreme in costs due to the amount of prior wafer processing and semiconductor structures. The inventors have observed that accurate and more timely evaluation of the wafers may reduce the research and development time for design of experiments, accelerate the initial start-up ramp time to production, improve the time to recover from a maintenance event, and significantly reduce wafer loss, dramatically increasing wafer yields and reducing per wafer costs.

Accordingly, the inventors have provided methods and apparatus for accurate and early detection of wafer parameters, reducing wastes and costs during wafer processing.

SUMMARY

Methods, apparatus, and systems for providing multi-channel, in-situ, metrology of wafer parameters are provided herein.

In some embodiments, a system for monitoring wafer processing results may comprise at least one non-active chamber with at least one feedthrough access port where the feedthrough access port is configured to interact with a metrology apparatus, where the at least one feedthrough access port has a surface exposed to an inner volume of the at least one non-active chamber that has a fluorine-based coating covering the surface, and where the at least one non-active chamber has a wafer access port to one or more other chambers; the metrology apparatus is positioned external to the at least one non-active chamber and is oriented to detect metrology data through one of the at least one feedthrough access port and a data collection apparatus connected to the metrology apparatus and configured to continuously receive data from the metrology apparatus.

In some embodiments, the system may further include a cleaning apparatus connected to at least one cleaning port where the at least one cleaning port is in proximity of one of the at least one metrology apparatus and where the cleaning apparatus is configured to inject radicals from a remote plasma source into the at least one non-active chamber via one of the at least one cleaning port to clean the fluorine-based coating covering the surface; where the cleaning apparatus is configured to supply fluorine or oxygen gas-based radicals into the at least one non-active chamber; where the cleaning apparatus is interconnected to the data collection apparatus and configured to perform cleaning when data from one of the at least one metrology apparatus is faulty; where one of the at least one feedthrough access port is a viewport; where the viewport is formed from a quartz material; where the metrology apparatus includes one or more of a reflectometer, an ellipsometer, and a micro-Raman spectroscopy device; a metrology process apparatus interconnected with one or more wafer process chambers, the metrology process apparatus includes a trained metrology model that is configured to receive the data from the data collection apparatus and is configured to alter at least one wafer process of the one or more wafer process chambers based on the data; where the fluorine-based coating is a metal fluoride-based coating or a non-metal fluorine-based coating; and/or where the at least one non-active chamber is a transfer chamber, a load lock chamber, or a via chamber.

In some embodiments, a system for monitoring wafer processing results may comprise a non-active chamber with a plurality of feedthrough access ports, wherein each of the plurality of feedthrough access ports is configured to interact with one of a plurality of metrology apparatus where each of the plurality of feedthrough access ports has a surface exposed to an inner volume of the non-active chamber that has a fluorine-based coating covering the surface, and wherein the non-active chamber has a wafer access port to one or more other chambers; each of the plurality of metrology apparatus positioned external to the non-active chamber and oriented to detect metrology data through one of the feedthrough access ports; a multi-channel data collection apparatus connected to the plurality of metrology apparatus and configured to continuously receive data from the plurality of metrology apparatus; a cleaning apparatus connected to a plurality of cleaning ports, wherein each of the plurality of cleaning ports is in proximity of one of the plurality of metrology apparatus and wherein the cleaning apparatus is configured to inject radicals from a remote plasma source into the non-active chamber via at least one of the plurality of cleaning ports to clean the fluorine-based coating covering the surface; and a metrology process apparatus interconnected with one or more wafer process chambers, the metrology process apparatus includes a trained metrology model that is configured to receive the data from the multi-channel data collection apparatus and configured to alter at least one wafer process of the one or more wafer process chambers based on the data.

In some embodiments, the system may further include where the cleaning apparatus is configured to supply fluorine or oxygen gas-based radicals into the non-active chamber; where the cleaning apparatus is interconnected to the multi-channel data collection apparatus and configured to perform cleaning when data from one or more of the plurality of metrology apparatus is faulty; where at least one of the feedthrough access ports is a viewport; where the viewport is formed from a quartz material; where the plurality of metrology apparatus may include one or more of a reflectometer, an ellipsometer, and a micro-Raman spectroscopy device; where the fluorine-based coating is a metal fluoride-based coating or a non-metal fluorine-based coating; and/or where the non-active chamber is a transfer chamber, a load lock chamber, or a via chamber.

In some embodiments, a method for monitoring wafer processing results may comprise continuously receiving data from a plurality of metrology apparatus connected to a non-active chamber via a feedthrough port into the non-active chamber, wherein the feedthrough port has a surface coated with a fluorine-based coating that is exposed to an inner volume of the non-active chamber, determining if wafer parameters are out of specification, inputting the data into a trained machine learning model that determines actions to remediate a wafer process to bring an out of specification wafer parameter to within specification, and sending a command to a process chamber to alter a process based on the actions determined by the trained machine learning model.

In some embodiments, the method may further include cleaning the surface with the fluorine-based coating using radicals produced by a remote plasma source when data from at least one of the plurality of metrology apparatus sends faulty data.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
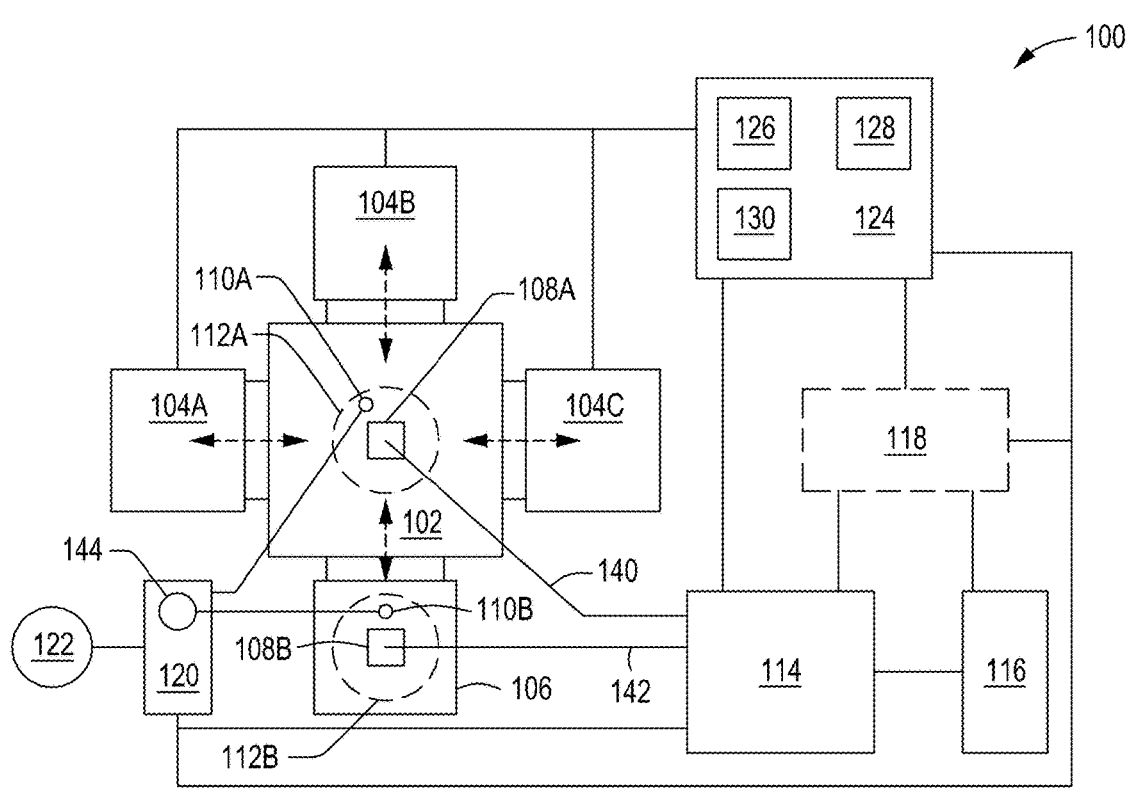
FIG. 1 depicts a top-down view of an in-situ multi-channel metrology system in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods, apparatus, and systems provide a solution to detect and measure parameters of wafers before and/or after wafer processing has occurred to prevent out-of-specification wafers. For example, the present principles may be used to measure post film deposition profile thicknesses, film stresses, and the like using, for example but not limited to, reflectometers and/or ellipsometers mounted on one or more viewport windows of a non-active chamber, such as a transfer chamber, via chamber, and/or load lock chamber of a semiconductor process mainframe and the like. The non-active chambers may be permanent parts of an integrated tool and the like and/or portable non-active chambers that are moved between other chambers to transport wafers in a controlled environment. The present principles have the benefits of providing an accurate, low-cost process to in-situ detection of wafer parameters before and/or after wafer processing without requiring costly and time-consuming modifications to existing semiconductor processing systems.

The present principles may be used for the detection of many wafer parameters before and/or after processing such as thickness, stress, temperature, composition of materials, cooling rates, and/or outgassing rates and the like. For the sake of brevity, a wafer parameter such as thickness may be used as an example parameter, but the present principles are not meant to be limited to only detection and evaluation of thickness parameters. During wafer processing, tracking deposition thickness can prove critical for semiconductor structure performance. Detection of film thickness drift needs to be quickly and accurately determined as soon as possible after the deposition process has been completed so that remedial procedures can take place. If the film thickness drift is allowed to continue for a lot of wafers, the entire lot may have to be scrapped, severely impacting wafer yield and costs of the semiconductor process.

Figure 6:
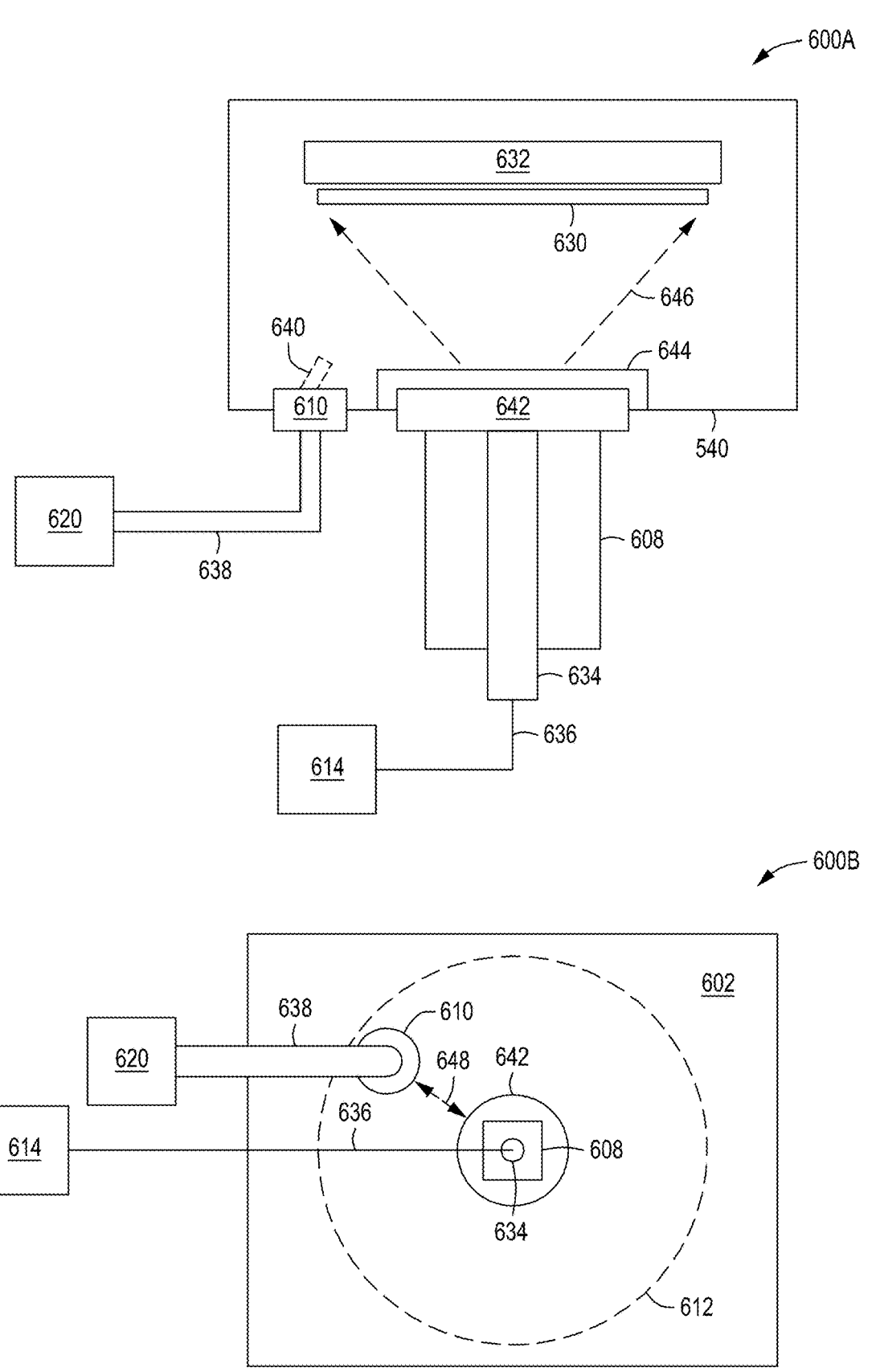
FIG. 6 depicts a cross-sectional view and a bottom-up configuration of an in-situ metrology apparatus mounted on a bottom of a non-active chamber in accordance with some embodiments of the present principles.

Manufacturers currently have no accurate way to measure film thickness inside of an integrated tool (see, e.g., FIG. 6). Most film thickness measurements occur after a lot of wafers have been processed and then the wafer lot is measured on dedicated measurement equipment outside of the integrated tool. In sharp contrast, the present principles disclosed herein can quickly scan and measure wafer parameters, such as film profile thickness, by using existing chamber viewports located, for example, on top or bottom of a non-active chamber. As discussed in more detail below, the use and modification of the viewports allows for easy retrofitting of apparatus and systems of the present principles to existing semiconductor processing configurations such as, but not limited to, integrated semiconductor processing tools. The present principles are compatible with the use of metrology systems that use reflectometers, ellipsometers, and/or micro-Raman spectroscopy devices, and the like. By using the viewports on the non-active chambers, wafer parameter detection can be performed without breaching the wafer environment in the non-active chamber. In some embodiments, cleaning methods, apparatus, and/or systems may be incorporated to ensure that the viewports remain unobstructed by fog or particulates originating from the wafers inside the non-active chambers. In some embodiments, at least the inside surfaces of the viewport material (e.g., quartz, etc.) is coated with an enhanced coating to reduce formations on the viewport material which would affect the wafer parameter detection/measurement.

FIG. 1 depicts a top-down view of an in-situ multi-channel wafer parameter monitoring system 100 in accordance with some embodiments. The in-situ multi-channel wafer parameter monitoring system 100 may comprise a first metrology apparatus 108A located on a first non-active chamber such as a transfer chamber 102 and a second metrology apparatus 108B on a second non-active chamber such as a load lock chamber 106. As used herein, a 'non-active chamber' is any chamber in which a wafer may be placed such as, but not limited to, a transfer chamber, a load lock chamber, and/or a via/passthrough chamber (e.g., interconnecting mainframes/integrated tools, etc.) and the like in which no active deposition or etching of the wafer takes place. A wafer may cool or outgas in a non-active chamber. In some embodiments, an active chamber may include deposition and/or etching processing of a wafer. An 'active chamber' or process chamber, as used herein, is a chamber that performs a process that alters the wafer, alters a structure on the wafer, and/or alters a film on the wafer such as a plasma vapor deposition (PVD) chamber, a chemical vapor deposition (CVD) chamber, an atomic layer deposition (ALD) chamber, an etching chamber, an annealing chamber, and the like. Although the example system of FIG. 1 includes only two metrology apparatus for brevity of the description, any number of metrology apparatus may be used. In some embodiments, a non-active chamber may include interim transfer chambers that maintain a wafer temperature, maintain an environment (e.g., vacuum pressure, humidity level, etc.), provide gas soaking of a wafer, and/or degassing of a wafer without any active deposition on or etching of the wafer.

The first metrology apparatus 108A is positioned on a feedthrough access port or a viewport window that resides above a first wafer position 112A. The second metrology apparatus 108B is position on a feedthrough access port or a viewport window that resides above a second wafer position 112B. The first metrology apparatus 108A is in communication via a first data channel 140 with a multi-channel data collection apparatus 114. The second metrology apparatus 108B is in communication via a second data channel 142 with the multi-channel data collection apparatus 114. The transfer chamber 102 can receive or send wafers to/from the load lock chamber 106 and also to a first process chamber 104A, a second process chamber 104B, and a third process chamber 104C. A wafer being processed passes through the first wafer position 112A prior to and/or after being processed in any of the three process chambers, allowing wafer parameter data to be collected before and/or after each of the three processes are performed.

In some embodiments, the wafer parameter data from the first data channel 140 and the second data channel 142 may be stored in a data storage 116 by the multi-channel data collection apparatus 114. The data storage 116 may be local to the multi-channel data collection apparatus 114 and/or remote to the multi-channel data collection apparatus 114 such as, for example, on a remote server and the like. The multi-channel data collection apparatus 114 is capable of receiving the data continuously and in real-time, permitting real-time responses should data fall outside acceptable parameters for a particular process or processes. In some embodiments, the multi-channel data collection apparatus 114 may further analyze the data to determine if a remedial action is necessary. For example, if the data indicates that a parameter such as thickness has drifted beyond acceptable levels over a number of wafers, the multi-channel data collection apparatus 114 may send a halt or stop command to cease processing of a wafer lot. The remedial action may be sent directly to a particular process chamber or mainframe (integrated tool) directly and/or indirectly via a system controller 124. The system controller 124 generally includes a Central Processing Unit (CPU) 126, a memory 128, and a support circuit 130. The CPU 126 may be any form of a general-purpose computer processor that can be used in an industrial setting. The support circuit 130 is conventionally coupled to the CPU 126 and may comprise a cache, clock circuits, input/output subsystems, power supplies, and the like. Software routines, such as a method as described below (e.g., see FIG. 7) may be stored in the memory 128 and, when executed by the CPU 126, transform the CPU 126 into a specific purpose computer (system controller) 124. The software routines may also be stored and/or executed by a second controller (not shown) that is located remotely.

In some embodiments, an optional process analysis apparatus 118 may be utilized to further analyze the data received either directly from the multi-channel data collection apparatus 114 and/or from the data storage 116. The optional process analysis apparatus 118 may be used to analyze the data with a model trained with training data to allow inferences to be used to detect out of specification parameters and/or to remediate wafer processes to bring the wafer specifications back to acceptable levels. The optional process analysis apparatus 118 may be in communication with the multi-channel data collection apparatus 114, the data storage 116, and/or the system controller 124. In some embodiments, a cleaning apparatus 120 may be used to purge and/or actively clean the feedthrough port or viewport windows of particulates or fog caused by environmental contaminations in the non-active chambers such as when wafers outgas after being processed in a process chamber. The wafers will naturally outgas as the wafers cool down after the high process temperatures used during processing. The outgassing may fog over and block the metrology apparatus from being able to "see" the wafer and/or reduce visibility to a level that produces erroneous readings by the metrology apparatus. If the fogging and/or particle build up is sufficient enough, the metrology apparatus may read the build up on the viewport rather than the wafer.

The cleaning apparatus 120 may include a remote plasma source 144 that receives one or more cleaning gases from a gas supply 122 to produce radicals that are then delivered, for example, to a first cleaning port 110A of transfer chamber 102 and/or to a second cleaning port 1106 of load lock chamber 106 to clean the respective viewport for a metrology apparatus. In some embodiments, the gas may be nitrogen trifluoride ($NF_3$) gas which is disassociated by the plasma to form fluorine radicals. The fluorine radicals clean out the chamber from any type of wafer outgassing or buildup on the viewport (feedthrough ports) of the metrology apparatus. Cleaning may be performed, for example, on periodic intervals, after a particular process is performed, after a number of wafers have been processed, and/or continuously and the like. In some embodiments, the cleaning apparatus 120 may be in communication with the multi-channel data collection apparatus 114, the system controller 124, and/or the optional process analysis apparatus 118. As such, the cleaning apparatus 120 may be controlled based on incoming data to the multi-channel data collection apparatus 114 (data no longer received/blocked view port, data intermittent, data incomplete, etc.) and/or based on analyzed data by the optional process analysis apparatus 118 (data integrity cannot be verified, data appears corrupt, data beyond extreme limits, etc.). The cleaning apparatus 120 may also be controlled by the system controller 124 based on the data and/or processing parameters, process recipes, profiles, etc. Each cleaning port may be controlled in unison or individually as needed.

Figure 2:
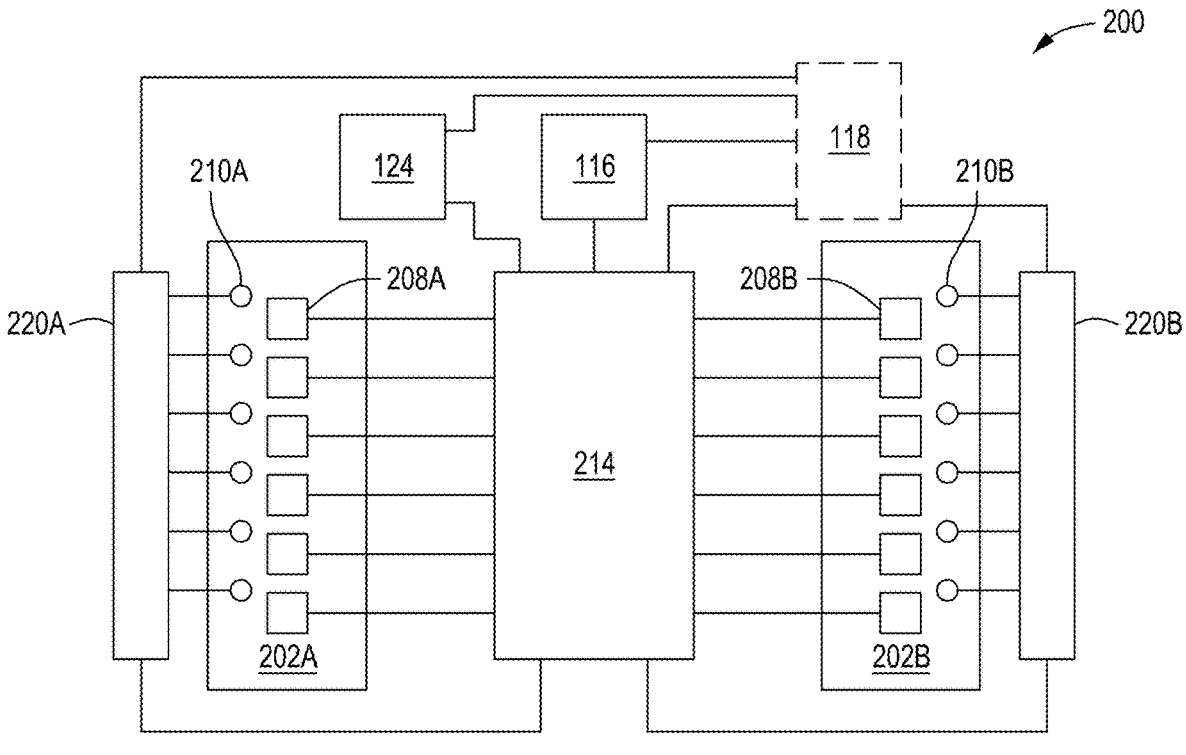
FIG. 2 depicts a top-down view of an in-situ multi-channel metrology system for multiple integrated tools in accordance with some embodiments of the present principles.

In some embodiments, the in-situ multi-channel wafer parameter monitoring system 100 may be expanded to include a plurality of mainframe or integrated tools. In FIG. 2, an in-situ multi-channel wafer parameter monitoring system 200 has a multi-channel data collection apparatus 214 that is in communication with a first plurality of metrology apparatus 208A on a first mainframe 202A and a second plurality of metrology apparatus 208B on a second mainframe 202B. The first mainframe 202A has a first plurality of cleaning ports 210A which is in fluid communication with a first cleaning apparatus 220A, and the second mainframe 202B has a second plurality of cleaning ports 210B which is in fluid communication with a second cleaning apparatus 220B. In some embodiments, the first plurality of cleaning ports 210A and the second plurality of cleaning ports 210B may be in fluid communication with a single cleaning apparatus.

In the example of FIG. 2, the multi-channel data collection apparatus 214 has six data channels per mainframe. However, the multi-channel data collection apparatus 214 may have any number of data channels connected to any number of mainframes. Data obtained from each mainframe may be used to determine when to halt a process or when remediation is necessary. The multi-channel data collection apparatus 214 can monitor each channel and make channel-to-channel comparisons as well as mainframe-to-mainframe comparisons. For example, but not limited to, if wafer processes performed in the first mainframe 202A are precursors to the wafer processes performed in the second mainframe, a wafer lot being processed may be monitored and processing parameters adjusted or altered based on data obtained from both mainframes to maintain desired wafer parameters. In a similar fashion, redundant mainframes may be used to increase wafer processing throughput and the data from each can be compared to ensure that the wafers are within specifications and that each similar chamber is operating to yield the same wafer parameters levels.

Figure 3:
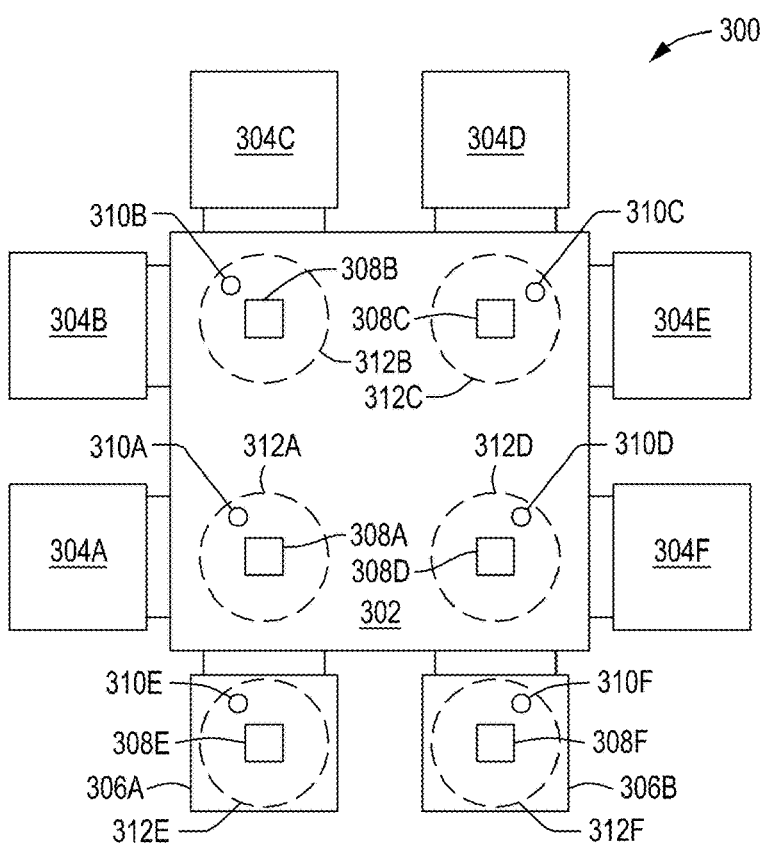
FIG. 3 depicts a top-down view of a first example of non-active chambers with in-situ metrology in accordance with some embodiments of the present principles.

The in-situ multi-channel wafer parameter monitoring systems described above are compatible with different types of non-active chamber layouts. In FIG. 3, a top-down view 300 depicts a mainframe design with a square-shaped transfer chamber 302 surrounded on three sides by process chambers 304A-304F. On the fourth side is two load lock chambers 306A, 306B. The transfer chamber 302 has four wafer positions 312A-312D that may be used to monitor wafers before and/or after processing in the process chambers 304A-304F. Metrology apparatus 308A-308D are positioned at a feedthrough port above each of the four wafer positions 312A-312D. Four cleaning ports 310A-310D are also shown in proximity of the metrology apparatus 308A-308D to permit cleaning of the feedthrough ports for each of the metrology apparatus 308A-308D. Each of the load lock chambers 306A, 306B also have a metrology apparatus 308E, 308F and a cleaning port 310E, 310F above each of the two wafer positions 312E, 312F, respectively.

Figure 4:
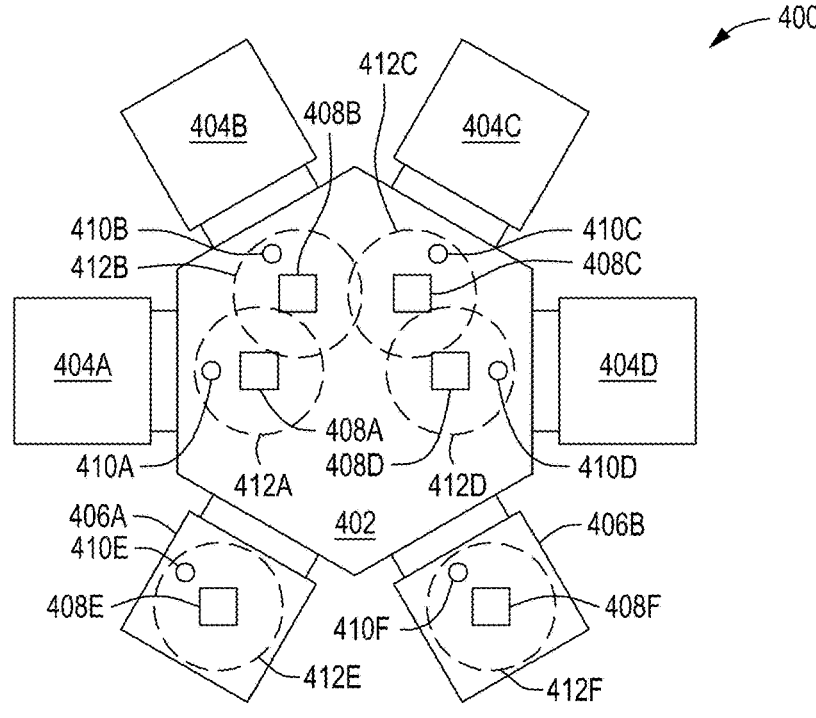
FIG. 4 depicts a top-down view of a second example of non-active chambers with in-situ metrology in accordance with some embodiments of the present principles.

In FIG. 4, a top-down view 400 depicts a mainframe design with a hexagon-shaped transfer chamber 402 surrounded on four sides by process chambers 404A-404D. On the fifth and sixth sides are two load lock chambers 406A, 406B. The transfer chamber 402 has four wafer positions 412A-412D that may be used to monitor wafers before and/or after processing in the process chambers 404A-404D. Metrology apparatus 408A-408D are positioned at a feedthrough port above each of the four wafer positions 412A-412D. Four cleaning ports 410A-410D are also shown in proximity of the metrology apparatus 408A-408D to permit cleaning of the feedthrough ports for each of the metrology apparatus 408A-408D. Each of the load lock chambers 406A, 406B also have a metrology apparatus 408E, 408F and a cleaning port 410E, 410F above each of the two wafer positions 412E, 412F, respectively. The examples depicted in FIGS. 3 and 4 are meant to show the flexibility of the present principles. The type and/or shape of the non-active chambers are not meant to be limiting.

Figure 5:
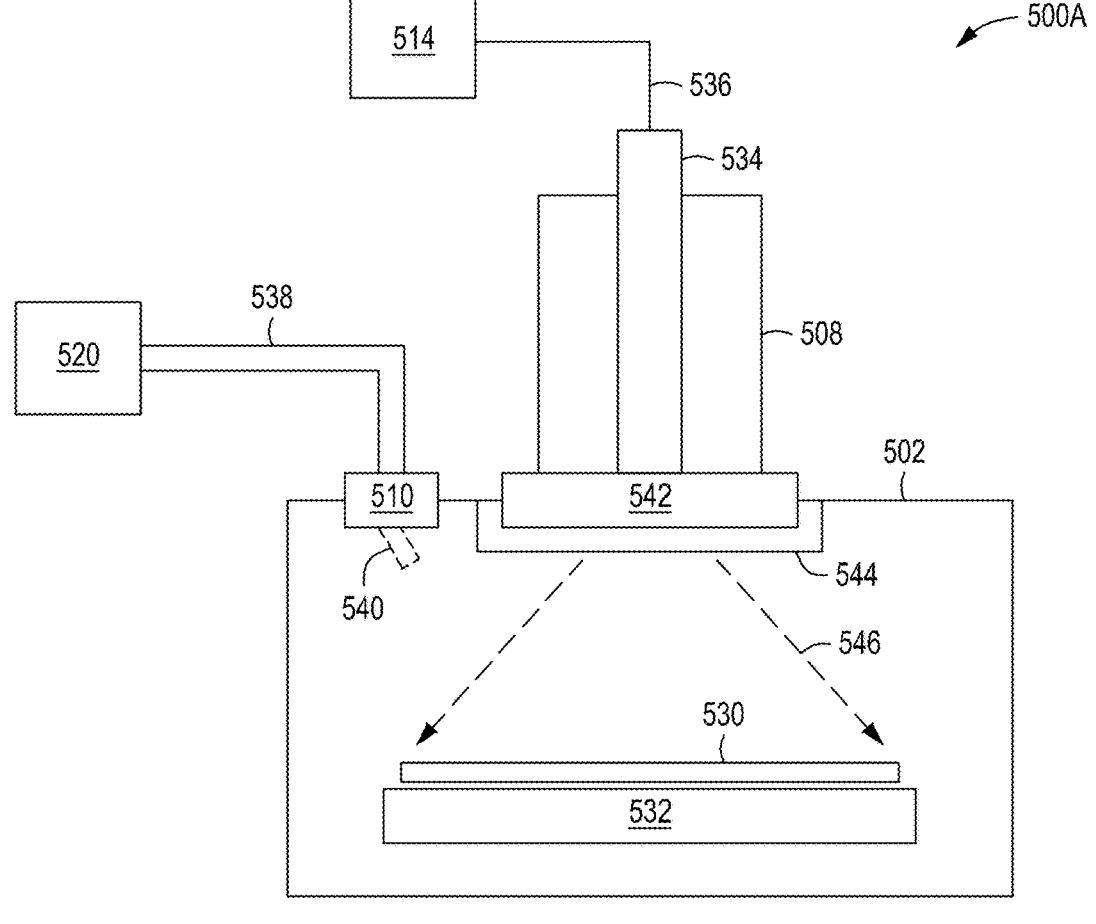
FIG. 5 depicts a cross-sectional view and a top-down configuration of an in-situ metrology apparatus mounted on a top of a non-active chamber in accordance with some embodiments of the present principles.
Figure 5:
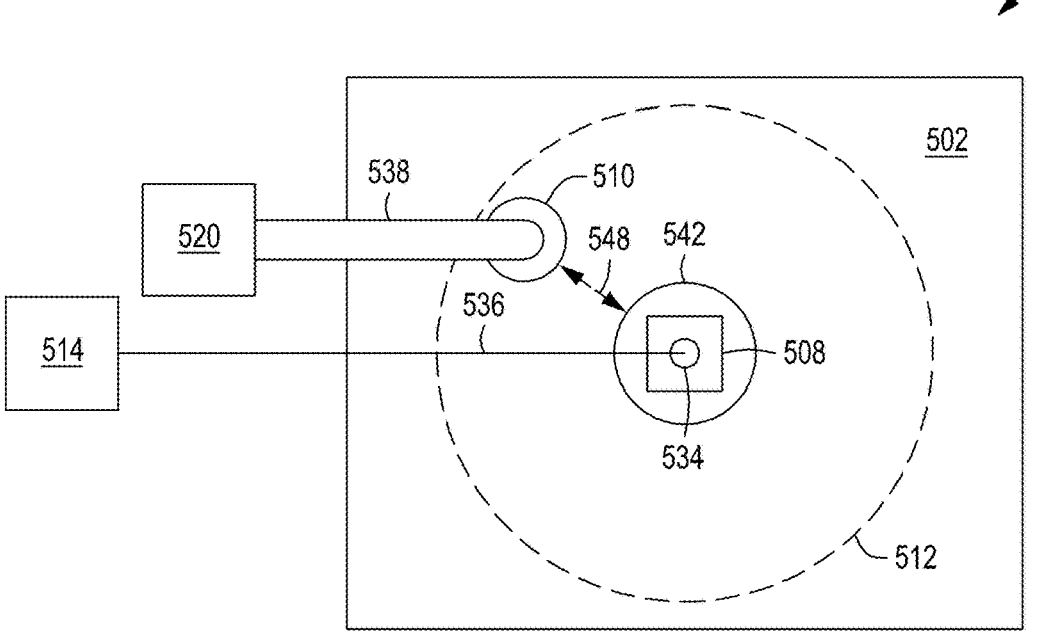

FIG. 5 depicts a cross-sectional view 500A and a top-down view 500B of a metrology apparatus 508 mounted to top of a non-active chamber 502. In some embodiments, the metrology apparatus 508 may contain a metrology system 534 such as, but not limited to, a reflectometer, an ellipsometer, and/or micro-Raman spectroscopy device, and the like. In the example of FIG. 5, the metrology system 534 is in communication 536 with a multi-channel data collection apparatus 514, but the multi-channel data collection apparatus 514 may also be in communication with other apparatus such as an analysis apparatus and/or a system controller and the like (see, e.g., FIGS. 1 and 2). The metrology apparatus 508 is positioned via a feedthrough port 542 (e.g., a viewport, etc.) to allow metrology coverage (indicated by, for example, the field of view 546 of the metrology system 534) of a wafer 530 with a wafer position 512 under the metrology apparatus 508 via a carrier 532 after and/or prior to wafer processing in a process chamber. In some embodiments, the feedthrough port 542 as depicted in the top-down view 500B of FIG. 5 may be larger in surface area than the metrology apparatus 508. In some embodiments, the feedthrough port 542 may be the same surface area as the metrology apparatus 508 or smaller than the metrology apparatus 508.

The material (e.g., quartz, etc.) of the feedthrough port 542 is coated with a fluorine-based coating layer 544. In some embodiments, the material of the feedthrough port 542 may be altered/changed to allow enhancements of the metrology data for a specific type of metrology apparatus and the like (e.g., filtering certain wavelengths, etc.). The fluorine-based coating layer 544 is transparent and, in some embodiments, has the following properties—functions as an anti-reflection coating (ARC) to increase wavelength/range specific transmissivity to enhance the capture of metrology data for the metrology system to ensure reliable and fast data acquisition, functions as an anti-adhesion coating to prevent surface/window fogging by outgassing or volatile contaminants, and/or functions to highly resist damage due to cleaning gases or cleaning radicals produced by a cleaning system 520 for the metrology apparatus 508. In some embodiments, the fluorine-based coating layer 544 may be a metal fluoride coating layer such as, but not limited to, magnesium fluoride, aluminum fluoride, yttrium fluoride, calcium fluoride, and/or lanthanum fluoride and the like. In some embodiments, the fluorine-based coating layer 544 may be a non-metal fluorine coating layer such as, but not limited to, fluorine doped or alloyed quartz or silica, or $SiO_xF_y$ coatings, or fluorine doped or alloyed boron nitride, or $BN_xF_y$ coatings, or any combination thereof.

The cleaning system 520 produces radicals via remote plasma and is fluidly connected via a cleaning tube 538 and cleaning port 510 to the non-active chamber 502 in proximity to the metrology apparatus 508. The cleaning port 510 may also include one or more optional cleaning nozzles 540 that may be directed towards the feedthrough port 542 of the metrology apparatus 508. In some embodiments, the cleaning port 510 is within a distance 548 (see top-down view 500B of FIG. 5) of 5 centimeters of the feedthrough port 542. In some embodiments, the cleaning port 510 is within 2 centimeters (distance 548) of the feedthrough port 542. In some embodiments, more than one cleaning port may be used for each of the metrology apparatus to increase the cleaning of the feedthrough port and the fluorine-based coating layer. In some embodiments, a single cleaning port may be used to clean a plurality of feedthrough ports and fluorine-based coating layers. For example, a cleaning port may have a plurality of cleaning nozzles to direct cleaning radicals/gases towards each feedthrough port from a single cleaning port.

FIG. 6 depicts a cross-section view 600A and a bottom-up view 600B of an in-situ metrology apparatus mounted on a bottom of a non-active chamber in accordance with some embodiments. A bottom mounted in-situ metrology apparatus may be used in conjunction with backside deposition systems and the like. In some embodiments, the metrology apparatus 608 may contain a metrology system 634 such as, but not limited to, a reflectometer, an ellipsometer, and/or micro-Raman spectroscopy device, and the like. In the example of FIG. 6, the metrology system 634 is in communication 636 with a multi-channel data collection apparatus 614, but the multi-channel data collection apparatus 614 may also be in communication with other apparatus such as an analysis apparatus and/or a system controller and the like (see, e.g., FIGS. 1 and 2). The metrology apparatus 608 is positioned via a feedthrough port 642 (e.g., a viewport, etc.) to allow metrology coverage (indicated by, for example, the field of view 646 of the metrology system 634) of a wafer 630 with a wafer position 612 above the metrology apparatus 608 via a substrate holder 632 after and/or prior to wafer processing in a process chamber. In some embodiments, the feedthrough port 642 as depicted in the bottom-up view 600B of FIG. 6 may be larger in surface area than the metrology apparatus 608. In some embodiments, the feedthrough port 642 may be the same surface area as the metrology apparatus 608 or smaller than the metrology apparatus 608.

The material (e.g., quartz, etc.) of the feedthrough port 642 is coated with a fluorine-based coating layer 644. In some embodiments, the material of the feedthrough port 642 may be altered/changed to allow enhancements of the metrology data for a specific type of metrology apparatus and the like (e.g., filtering certain wavelengths, etc.). The fluorine-based coating layer 644 is transparent and, in some embodiments, has the following properties—functions as an anti-reflection coating (ARC) to increase wavelength/range specific transmissivity to enhance the capture of metrology data for the metrology system to ensure reliable and fast data acquisition, functions as an anti-adhesion coating to prevent surface/window fogging by outgassing or volatile contaminants, and/or functions to highly resist damage due to cleaning gases or cleaning radicals produced by a cleaning system 620 for the metrology apparatus 608. In some embodiments, the fluorine-based coating layer 644 may be a metal fluoride coating layer such as, but not limited to, magnesium fluoride, aluminum fluoride, yttrium fluoride, calcium fluoride, and/or lanthanum fluoride and the like. In some embodiments, the fluorine-based coating layer 644 may be a non-metal fluorine coating layer such as, but not limited to, fluorine doped or alloyed quartz or silica, or $SiO_xF_y$ coatings, or fluorine doped or alloyed boron nitride, or $BN_xF_y$ coatings, or any combination thereof.

The cleaning system 620 produces radicals via remote plasma and is fluidly connected via a cleaning tube 638 and cleaning port 610 to the non-active chamber 602 in proximity to the metrology apparatus 608. The cleaning port 610 may also include one or more optional cleaning nozzles 640 that may be directed towards the feedthrough port 642 of the metrology apparatus 608. In some embodiments, the cleaning port 610 is within a distance 648 (see bottom-up view 600B of FIG. 6) of 6 centimeters of the feedthrough port 642. In some embodiments, the cleaning port 610 is within 2 centimeters (distance 648) of the feedthrough port 642. In some embodiments, more than one cleaning port may be used for each of the metrology apparatus to increase the cleaning of the feedthrough port and the fluorine-based coating layer. In some embodiments, a single cleaning port may be used to clean a plurality of feedthrough ports and fluorine-based coating layers. For example, a cleaning port may have a plurality of cleaning nozzles to direct cleaning radicals/gases towards each feedthrough port from a single cleaning port.

Figure 7:
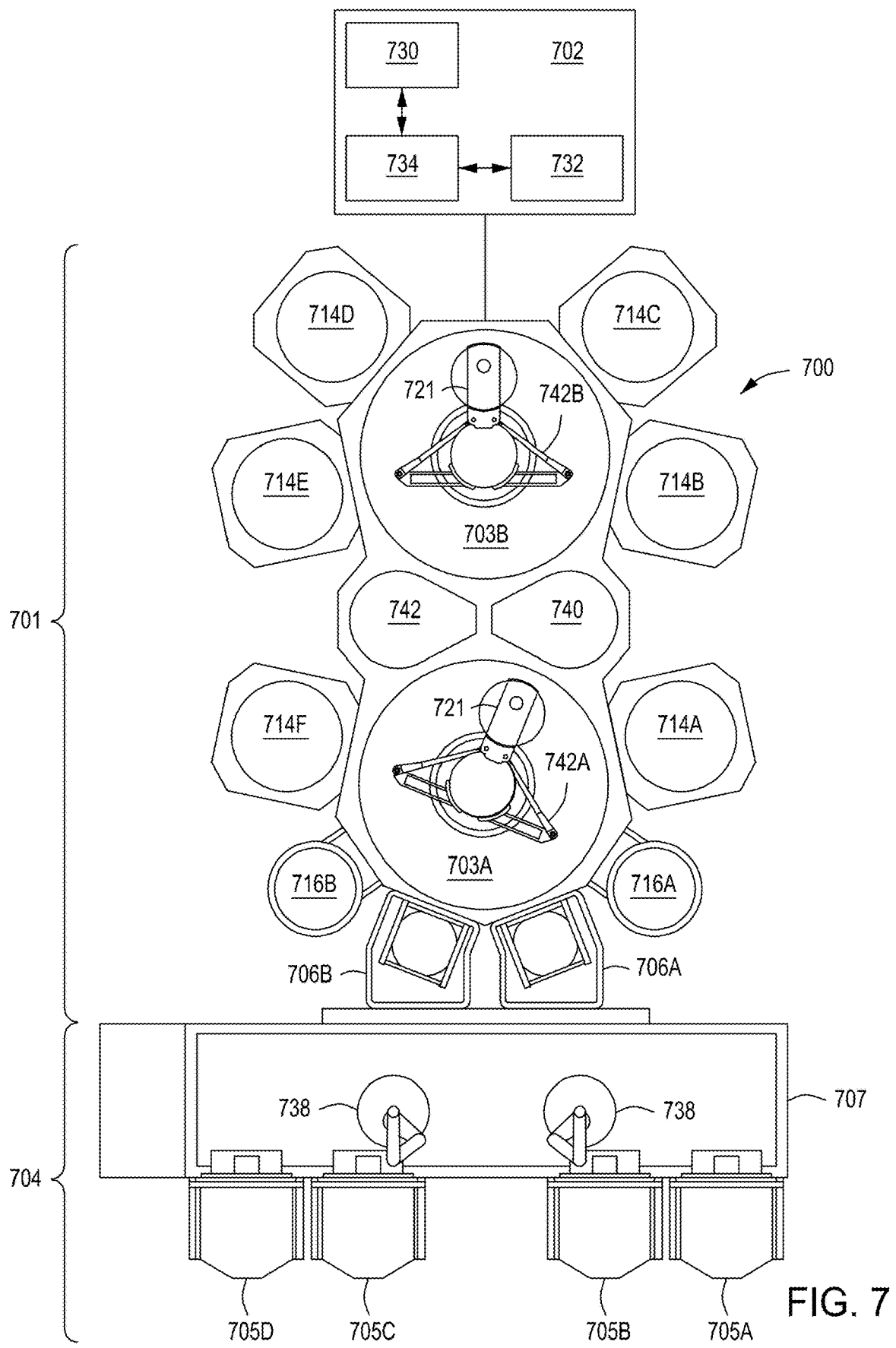
FIG. 7 is a top-down view of an integrated tool in accordance with some embodiments of the present principles.

The apparatus and systems of the present principles described above may be retrofitted to or otherwise integrated into the design of a cluster tool, for example, the integrated tool 700 (i.e., mainframe or cluster tool) described below with respect to FIG. 7. The integrated tool 700 includes a vacuum-tight processing platform 701, a factory interface 704, and a system controller 702. The processing platform 701 comprises multiple processing chambers, such as 714A, 713B, 714C, 714D, 714E, and 714F operatively coupled to a vacuum substrate transfer chamber (transfer chambers 703A, 703B, where metrology apparatus of the present principles may be installed). The factory interface 704 is operatively coupled to the transfer chamber 703A by one or more load lock chambers (two load lock chambers, such as 706A and 706B shown in FIG. 7).

In some embodiments, the factory interface 704 comprises at least one docking station 707, at least one factory interface robot 738 to facilitate the transfer of the semiconductor substrates. The docking station 707 is configured to accept one or more front opening unified pod (FOUP). Four FOUPS, such as 705A, 705B, 705C, and 705D are shown in the embodiment of FIG. 7. The factory interface robot 738 is configured to transfer the substrates from the factory interface 704 to the processing platform 701 through the load lock chambers, such as 706A and 706B. Each of the load lock chambers 706A and 706B have a first port coupled to the factory interface 704 and a second port coupled to the transfer chamber 703A. The load lock chamber 706A and 706B are coupled to a pressure control system (not shown) which pumps down and vents the load lock chambers 706A and 706B to facilitate passing the substrates between the vacuum environment of the transfer chamber 703A and the substantially ambient (e.g., atmospheric) environment of the factory interface 704. The transfer chambers 703A, 703B have vacuum robots 742A, 742B disposed in the respective transfer chambers 703A, 703B. The vacuum robot 742A is capable of transferring substrates 721 between the load lock chamber 706A, 706B, the processing chambers 714A and 714F and a cooldown station 740 or a pre-clean station 742. The vacuum robot 742B is capable of transferring substrates 721 between the cooldown station 740 or pre-clean station 742 and the processing chambers 714B, 714C, 714D, and 714E.

In some embodiments, the processing chambers 714A, 714B, 714C, 714D, 714E, and 714F are coupled to the transfer chambers 703A, 703B. The processing chambers 714A, 714B, 714C, 714D, 714E, and 714F may comprise, for example, an atomic layer deposition (ALD) process chamber, a physical vapor deposition (PVD) process chamber, chemical vapor deposition (CVD) chambers, annealing chambers, or the like. In some embodiments, one or more optional service chambers (shown as 716A and 716B) may be coupled to the transfer chamber 703A. The service chambers 716A and 716B may be configured to perform other substrate processes, such as degassing, orientation, substrate metrology, cool down, and the like. The system controller 702 controls the operation of the tool 700 using a direct control of the process chambers 714A, 714B, 714C, 714D, 714E, and 714F or alternatively, by controlling the computers (or controllers) associated with the process chambers 714A, 714B, 714C, 714D, 714E, and 714F and the tool 700. In operation, the system controller 702 enables data collection and feedback from the respective chambers and systems to optimize performance of the tool 700. The system controller 702 generally includes a Central Processing Unit (CPU) 730, a memory 734, and a support circuit 732. The CPU 730 may be any form of a general-purpose computer processor that can be used in an industrial setting. The support circuit 732 is conventionally coupled to the CPU 730 and may comprise a cache, clock circuits, input/output subsystems, power supplies, and the like. Software routines, such as a method as described above may be stored in the memory 734 and, when executed by the CPU 730, transform the CPU 730 into a specific purpose computer (system controller) 702. The software routines may also be stored and/or executed by a second controller (not shown) that is located remotely from the tool 700.

Figure 8:
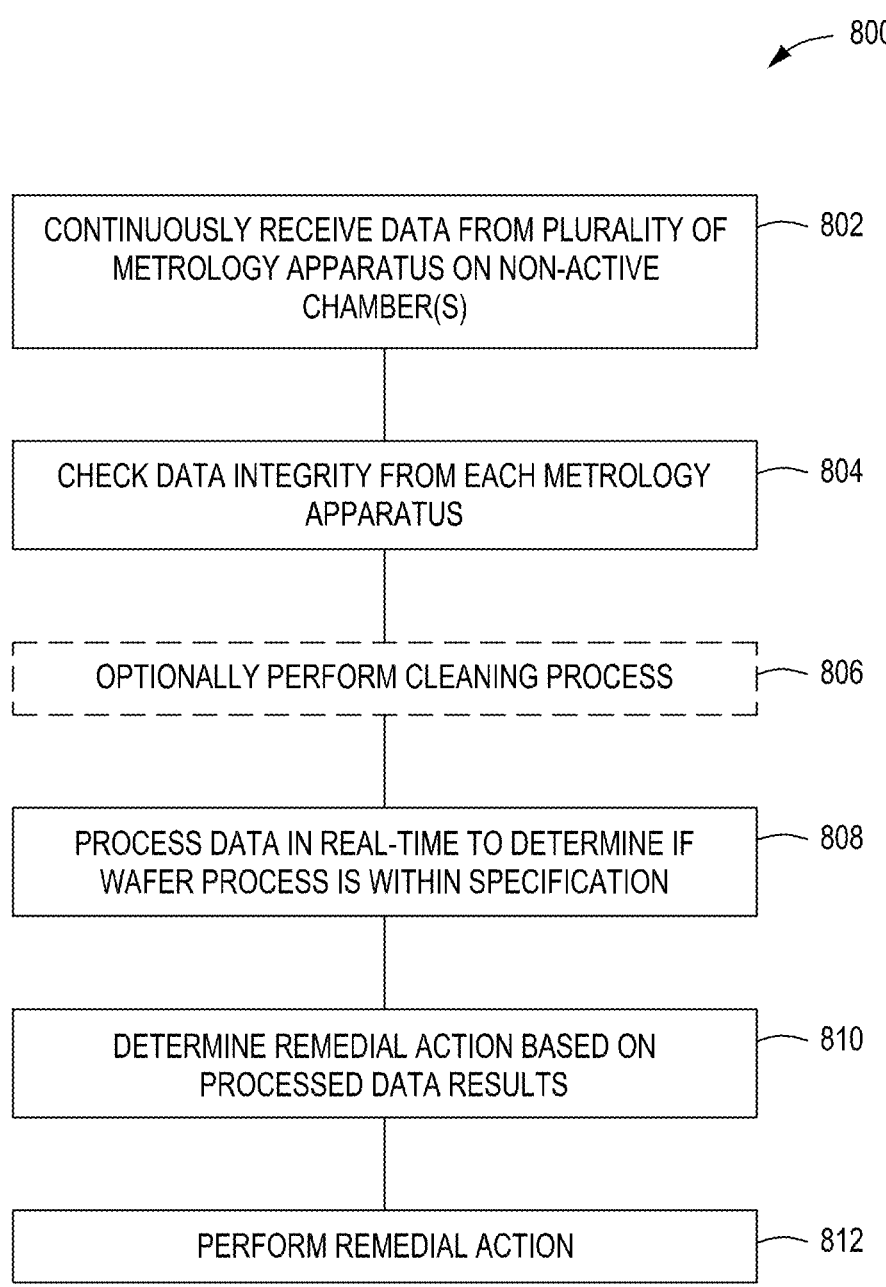
FIG. 8 is a method of preventing out-of-specification wafer parameters using in-situ metrology apparatus on non-active chambers in accordance with some embodiments of the present principles.

FIG. 8 is a method 800 of preventing out-of-tolerance or out-of-specification wafer parameters using in-situ metrology apparatus on non-active chambers. During processing of a wafer, thickness drift, stresses, processing hardware excursions, and/or other factors may cause a process to produce out-of-specification wafers. In block 802, data from a plurality of metrology apparatus from one or more non-active chambers is continuously received by a multi-channel data collection apparatus. In some embodiments, the multi-channel data collection apparatus collects, processes, and stores the data. In block 804, the data is checked to see if a metrology apparatus is reporting data correctly. If not, in block 806, an optional cleaning process may be invoked to clean the feedthrough port for that particular metrology apparatus. The cleaning may continue until the data reported by the metrology apparatus is reported correctly. In some embodiments, the cleaning process may be invoked on a periodic bases to ensure that data reported by the metrology apparatus is correct. In block 808, the multi-channel data collection apparatus processes the data in real-time to determine if the wafer process is within specifications. Data integrity checks and processing may include channel-to-channel data comparisons for a single platform (e.g., see FIG. 1) and/or between multiple platforms (e.g., see FIG. 2).

In some embodiments, the multi-channel data collection apparatus may also employ an optional process analysis apparatus that uses a trained machine learning model to assist with processing of the data to determine if the data is within specifications for a given wafer process. In block 810, the multi-channel data collection apparatus and/or the optional process analysis apparatus and model determines what remedial action is needed based on the processed data results. The remedial actions may include, but are not limited to, adjusting of the process such as adjusting a process recipe or profile, halting the wafer processing, and/or providing notification to a user such as sounding an audible or visual alarm and the like. In block 812, the remedial action is performed. The multi-channel data collection apparatus and/or the optional process analysis apparatus and/or model may be in direct or indirect communication with a user or the process chamber and engage commands or direction such that the remedial action determined based on the processed data results is actively performed, preventing further waste and reduced yield.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A system for monitoring wafer processing results, comprising:

at least one non-active chamber with at least one feedthrough access port, wherein the feedthrough access port is configured to interact with a metrology apparatus, wherein the at least one feedthrough access port has a surface exposed to an inner volume of the at least one non-active chamber that has a fluorine-based coating covering the surface, and wherein the at least one non-active chamber has a wafer access port to one or more other chambers;

the metrology apparatus positioned external to the at least one non-active chamber and oriented to detect metrology data through one of the at least one feedthrough access port;

a cleaning apparatus connected to at least one cleaning port, wherein the at least one cleaning port is positioned on a top or a bottom of the at least one non-active chamber, wherein one of the at least one cleaning port is in proximity of at least one feedthrough access port, wherein the cleaning apparatus interacts with a remote plasma source and is configured to inject radicals from the remote plasma source into the at least one non-active chamber via one of the at least one cleaning port to clean the fluorine-based coating covering the surface, and wherein the at least one cleaning port has at least one nozzle directed towards the at least one feedthrough access port; and a data collection apparatus connected to the metrology apparatus and configured to continuously receive data from the metrology apparatus.

2. The system of claim 1, wherein the at least one nozzle is a plurality of nozzles with at least one of the plurality of nozzles directed towards each of the at least one feedthrough access port and wherein the plurality of nozzles is connected to one of the at least one cleaning port.

3. The system of claim 1, wherein the cleaning apparatus is within 6 cm or less of the at least one feedthrough access port and wherein the cleaning apparatus is configured to supply fluorine or oxygen gas-based radicals into the at least one non-active chamber.

4. The system of claim 1, wherein the cleaning apparatus is interconnected to the data collection apparatus and configured to perform cleaning when data from the metrology apparatus is faulty.

5. The system of claim 1, wherein one of the at least one feedthrough access port is a viewport.

6. The system of claim 5, wherein the viewport is formed from a quartz material.

7. The system of claim 1, wherein the metrology apparatus includes one or more of a reflectometer, an ellipsometer, and a micro-Raman spectroscopy device.

8. The system of claim 1, further comprising:

a metrology process apparatus interconnected with one or more wafer process chambers, the metrology process apparatus includes a trained metrology model that is configured to receive the data from the data collection apparatus and configured to alter at least one wafer process of the one or more wafer process chambers based on the data.

9. The system of claim 1, wherein the fluorine-based coating is a non-metal fluorine-based coating.

10. The system of claim 1, wherein the at least one non-active chamber is a transfer chamber, a load lock chamber, or a via chamber.

11. A system for monitoring wafer processing results, comprising:
   a first mainframe of non-active chambers with a first plurality of feedthrough access ports, wherein each of the first plurality of feedthrough access ports is configured to interact with one of a first plurality of metrology apparatus, wherein each of the first plurality of feedthrough access ports has a surface exposed to an inner volume of a non-active chamber of the first mainframe that has a fluorine-based coating covering the surface, and wherein the non-active chamber of the first mainframe has a wafer access port to one or more other chambers of the first mainframe;
   a second mainframe of non-active chambers with a second plurality of feedthrough access ports, wherein each of the second plurality of feedthrough access ports interacts with one of a second plurality of metrology apparatus, wherein each of the second plurality of feedthrough access ports has a surface exposed to an inner volume of the non-active chamber of the second mainframe that has a fluorine-based coating covering the surface, and wherein the non-active chamber of the second mainframe has a wafer access port to one or more other chambers of the second mainframe;
   each of the first plurality of metrology apparatus and the second plurality of metrology apparatus are positioned external to the non-active chambers of the first mainframe and the second mainframe, respectively, and oriented to detect metrology data through one of the first plurality of feedthrough access ports and one of the second plurality of feedthrough access ports, respectively;
   a multi-channel data collection apparatus connected to the first plurality of metrology apparatus and the second plurality of metrology apparatus and configured to continuously receive data from the first plurality of metrology apparatus of the first mainframe and receive data from the second plurality of metrology apparatus of the second mainframe, wherein the multi-channel data collection apparatus is configured to make first mainframe to second mainframe comparisons of data received from the first plurality of metrology apparatus and the second plurality of metrology apparatus;
   a first cleaning apparatus connected to a first plurality of cleaning ports, wherein the first plurality of cleaning ports is positioned on a top or a bottom of the non-active chambers of the first mainframe, wherein each of the first plurality of cleaning ports is in proximity of one of the first plurality of metrology apparatus and wherein the first cleaning apparatus is configured to inject radicals from a remote plasma source into the non-active chambers of the first mainframe via at least one of the first plurality of cleaning ports to clean the fluorine-based coating covering the surface;
   a second cleaning apparatus connected to a second plurality of cleaning ports, wherein the second plurality of cleaning ports is positioned on a top or a bottom of the non-active chambers of the second mainframe, wherein each of the second plurality of cleaning ports is in proximity of one of the second plurality of metrology apparatus and wherein the second cleaning apparatus is configured to inject radicals from a remote plasma source into the non-active chambers of the second mainframe via at least one of the second plurality of cleaning ports to clean the fluorine-based coating covering the surface; and
   a metrology process apparatus interconnected with the first mainframe, the second mainframe, and the multi-channel data collection apparatus, the metrology process apparatus includes a trained metrology model that is configured to receive the data from the multi-channel data collection apparatus and configured to alter at least one wafer process of the first mainframe to improve a process of the second mainframe, different from the first mainframe, based on the data.

12. The system of claim 11, wherein the first cleaning apparatus and the second cleaning apparatus are configured to supply fluorine or oxygen gas-based radicals into the non-active chamber.

13. The system of claim 11, wherein the first cleaning apparatus and the second cleaning apparatus are interconnected to the multi-channel data collection apparatus and configured to perform cleaning when data from one or more of the first plurality of metrology apparatus or one or more of the second plurality of metrology apparatus is faulty.

14. The system of claim 11, wherein at least one of the first plurality of feedthrough access ports or at least one of the second plurality of feedthrough access ports is a viewport.

15. The system of claim 14, wherein the viewport is formed from a quartz material.

16. The system of claim 11, wherein the first plurality of metrology apparatus or the second plurality of metrology apparatus may include one or more of a reflectometer, an ellipsometer, and a micro-Raman spectroscopy device.

17. The system of claim 11, wherein the fluorine-based coating is a metal fluoride-based coating.

18. The system of claim 11, wherein the non-active chamber is a transfer chamber, a load lock chamber, or a via chamber.

19. A method for monitoring wafer processing results, comprising:
   continuously receiving data from a plurality of metrology apparatus connected to a non-active chamber via a feedthrough port into the non-active chamber, wherein the feedthrough port has a surface coated with a fluorine-based coating that is exposed to an inner volume of the non-active chamber;
   cleaning the surface with the fluorine-based coating using radicals produced by a remote plasma source via at least one cleaning port with at least one internal nozzle within 6 cm or less of the feedthrough port of the non-active chamber, wherein the at least one cleaning port is positioned on a top or a bottom of the non-active chamber;
   determining if wafer parameters are out of specification;
   inputting the data into a trained machine learning model that determines actions to remediate a wafer process to bring an out of specification wafer parameter to within specification; and
   sending a command to a process chamber to alter a process based on the actions determined by the trained machine learning model.

20. The method of claim 19, further comprising:

cleaning the surface with the fluorine-based coating using radicals produced by the remote plasma source when data from at least one of the plurality of metrology apparatus sends faulty data.

* * * * *